United States Patent [19]

Bossard et al.

[11] Patent Number: 4,559,896
[45] Date of Patent: Dec. 24, 1985

[54] COATING APPARATUS

[75] Inventors: Alfred E. Bossard, Mutschellen; Kaspar Kuster, Allschwil, both of Switzerland

[73] Assignee: Ciba Geigy Corporation, Ardsley, N.Y.

[21] Appl. No.: 648,198

[22] Filed: Sep. 7, 1984

[30] Foreign Application Priority Data

Sep. 15, 1983 [CH] Switzerland ............... 5031/83

[51] Int. Cl.$^4$ ............................................. B05B 1/04
[52] U.S. Cl. ........................................ 118/300; 118/326; 118/DIG. 4; 118/324; 427/420
[58] Field of Search .............. 427/420; 118/300, 326, 118/DIG. 4, 324; 53/509

[56] References Cited

U.S. PATENT DOCUMENTS

| | | | |
|---|---|---|---|
| 3,345,972 | 10/1967 | Masulis | 118/DIG. 4 |
| 3,434,457 | 3/1969 | Bass | 118/DIG. 4 |
| 3,867,901 | 2/1975 | Greiller | 118/DIG. 4 X |
| 4,060,649 | 11/1977 | Coleman | 118/DIG. 4 X |
| 4,135,477 | 1/1979 | Ridley | 118/DIG. 4 X |
| 4,230,793 | 10/1980 | Losert et al. | 430/315 |

FOREIGN PATENT DOCUMENTS 1300746 12/1972 United Kingdom .
1463145 2/1977 United Kingdom .
2021001 11/1979 United Kingdom ......... 118/DIG. 4

Primary Examiner—Shrive P. Beck
Attorney, Agent, or Firm—Harry Falber

[57] ABSTRACT

A pouring head is arranged above a conveyer belt which carries objects to be coated with a coating material being poured from the pouring head in the form of a curtain extending transversely to the direction of travel of the belt. In order to limit the free falling curtain on both sides two rim severing organs are provided on each side of the curtain, one organ above the other, as well as curtain edge-guiding means, one for each severing organ, which are arranged each adjacent the severing organ to which it pertains. The lower severing organs are arranged a short distance above the conveyer belt.

The two severing organs comprise blades for cutting off marginal strips from the falling curtain in two successive stages, thus reducing the width of the curtain to a desired size. The lower severing organ serves mainly to cut off the rim bead being conventionally produced on the curtain where it slides downward on the curtain guiding means, thus preventing the occurrence of undesirably thick marginal zones in the coatings produced on the objects being moved underneath the pouring head by the conveyer belt.

19 Claims, 4 Drawing Figures

COATING APPARATUS

BACKGROUND OF THE INVENTION

This invention relates to a coating apparatus comprising a conveyer belt for objects to be coated, and a pouring head device arranged above the conveyer belt transversely to the direction of movement of the same, for producing a free-falling curtain of poured coating material, as well as lateral curtain-guiding means on either side of the curtain.

A coating apparatus (pouring machine) of this kind has, for instance, been described in European Pat. No. 2040 in connection with the production of solder-stop masks on printed circuit boards.

In these known apparatus, the curtain of coating material descending from a pouring head on to the object or objects to be coated is guided between two lateral curtain edge-guiding means and is thereby stabilized. Experience has shown that the thickness of the poured curtain is considerably larger in the vicinity of these edge-guiding means than in the central region of the curtain. In edgeless coating, i.e., when the entire surface of an object is to be coated, this thickening effect is of no particular importance, as in this case, it is not difficult to choose the width of the curtain to be so large that, in the pouring process, the thicker edge zones will flow down past both sides of the object being coated, and thus will not be deposited on the latter. It is, however, different in those cases in which, for some reason, the marginal zones of the object, opposite one another, are not to be coated so that the width of the curtain being deposited thereon must be less than the width of the object. In these cases, there will be produced, due to the thickened marginal beads of the curtain, correspondingly thickened lateral rims in the resulting coating which, in many cases, are not acceptable on the coated object.

OBJECTS AND SUMMARY OF THE INVENTION

It is an object of the invention so to improve a coating apparatus of the initially described kind that undesirably thickened coating edges are almost entirely or completely avoided.

This object is achieved by providing, in the coating apparatus according to the invention, a rim zone-severing device, at at least one of the two sides of the poured curtain, for laterally limiting the width of the latter, which rim zone-severing device is arranged a short distance above the level at which the curtain impinges upon the object to be coated; this rim zone-severing device comprises at least one separating member which projects, across a marginal zone, of the poured curtain, trims the width of the same, and removes, out of the range of the curtain, the coating material waste resulting from cutting off a marginal strip of the curtain, and further comprises an edge-guiding member, along the path of the downwardly moving curtain of narrowed width, which member extends from the point of cutting engagement of the separating member on members downward to closely above the level of impingement of the curtain on the objects to be coated.

A preferred embodiment of the coating apparatus of the invention, and particularly suitable advanced designs of parts thereof are described hereinafter and comprise one or several of the following features:

(1) The separating member cuts off substantially only the rim zone of the poured curtain which is thickened vis-a-vis the central region thereof, the cut-off marginal strip having advantageously a width of about 6 to 12 mm, and preferably about 8 to 10 mm.

(2) The lateral guiding means for the curtain being poured comprise, directly above the separating member, an outwardly inclined section which causes a broadening or spreading out of the curtain prior to its contact with the separating member.

(3) These lateral lateral guiding means for the curtain being poured extend downwardly at least to the level of the cutting engagement of the separating member with the curtain.

(4) The edge-guiding member can comprise a downwardly and inwardly inclined part which produces a slight reduction in the width of the poured curtain; but this inclined part can also be slightly downwardly and outwardly, in lieu of inwardly inclined.

(5) Each edge-guiding member can be slightly outwardly in its upper part, and slightly inwardly inclined in its lower part; the angle of inclination of the inwardly inclined part thereof relative to a vertical axis, amounting preferably to about 1 to 8 degrees, while the angle of inclination of the outwardly inclined part with the vertical axis can amount also to 1 to 8 degrees.

(6) The angle of inclination of the outwardly inclined section of the lateral guiding means with the vertical axis is preferably 0 to about 5 degrees.

(7) The distance of the lower edge of the edge-guiding member from the object to be coated amount preferably to about 3 to 5 mm.

(8) The distance from the level of cutting engagement of the separating member with the curtain down to the object to be coated is preferably about 30 to 40 mm.

(9) Each separating member is preferably provided with an inclined chute for leading off the cut-off coating material waste.

(10) Above the aforesaid separating member, there can be provided a second edge-guiding device as well as, connected therewith, a second separating member which will cut off and eject a first, wider marginal zone of the poured curtain, and guide the thus narrowed curtain to the first-mentioned, main or final separating member which then cuts off a second marginal zone to attain a curtain of the desired width for depositing on an object to be coated.

(11) This second separating member as well as the second edge-guiding member associated therewith can be designed in a manner, similar to the curtain-guiding means described in items (2), (3) and (6), supra.

(12) The two separating members together with their edge-guiding members are adjustable in common, in directions parallel with the pouring head, in order to set the desired ultimate width of the curtain to be deposited on the object to be coated..

BRIEF DESCRIPTION OF THE DRAWINGS

Preferred embodiments of the coating apparatus according to the invention are described hereinafter more in detail in connection with the accompanying drawings in which.

DETAILED DESCRIPTION OF THE EMBODIMENTS SHOWN IN THE DRAWINGS

Figure 1:
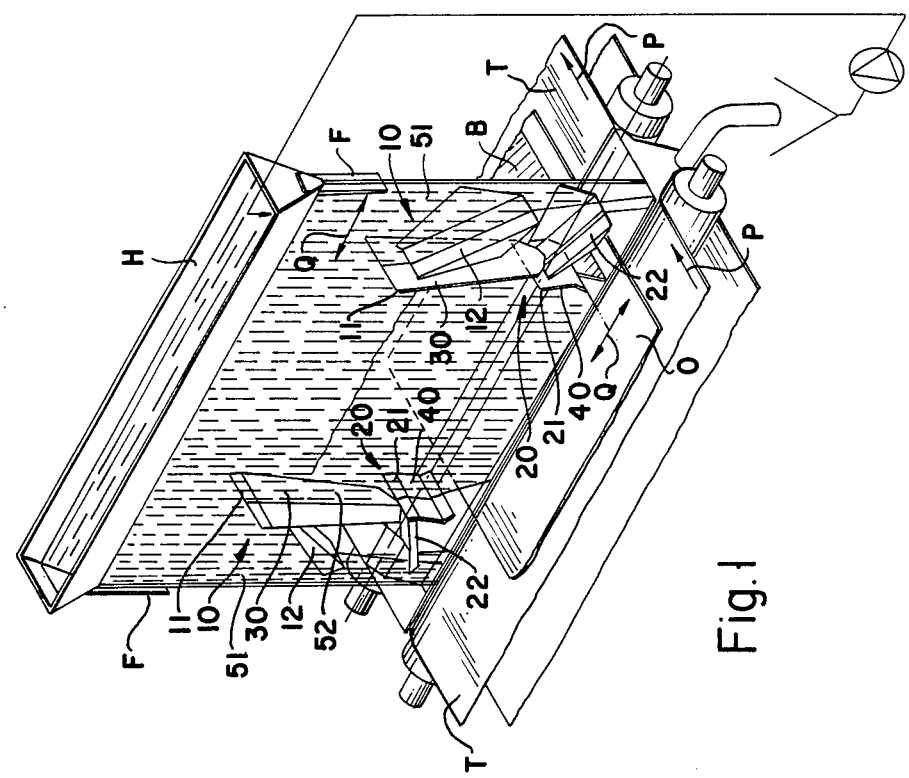
FIG. 1 is a schematic view, in perspective, of the most important parts of a preferred embodiment.

The illustrated coating apparatus comprises a conveyer belt T for the objects O to be coated, such as, for instance, printed circuit boards, an elongated pouring head H which extends transversely to the direction of movement (arrow P) of the conveyer belt T above the latter, as well as several electrical lines and drive means which have not been shown as they are merely conventional. All parts of the apparatus are, of course, arranged and housed in a single machine frame.

In operation, the pouring head H produces a poured curtain C which is limited on both sides thereof and stabilized by two lateral guiding plates F. The curtain is caused to fall freely on to the object O to be coated and is deposited thereon in the form of a coating B while the object is being moved underneath the pouring head H by the conveyer belt T. As described thus far, the coating apparatus is well known, so that a more detailed description of the same can be dispensed with.

Experience has shown that the thickness of the poured curtain C is not a constant one across its entire width, but that a noticeable rim bead is unavoidably formed at each of the indispensable lateral guiding plates F, which bead, depending on the rheological properties of the coating material, extends by a smaller or larger distance across the central region of the curtain. The width of those thickened marginal zones is as a rule about 5 to 15 mm.

When the object O is to be coated completely, this thickening effect is of no importance, as, in this case, the width of the curtain can simply be chosen correspondingly larger than the width of the object so that the thickened marginal zones will fall by the sides of the object and, therefore, will not be deposited on its surface, whereby the uniformity of the coating on the object will not be impaired. When, however, the width of the cotaing is to be smaller than that of the object, so that a marginal zone thereof is to be left uncoated on one or both sides of its surface, then the above-described thickening of the lateral curtain edges will have its full, undesirable effect and will generate at the lateral rims of the coating on the object a considerable thickening which, in many cases, is not permissible or, at least, undesirable and can lead to difficulties in the further processing or finishing of the coated object.

In order to avoid this drawback of the known pouring apparatus, there are provided in accordance with the invention, on each of the two sides of the poured curtain C, two rim-severing organs, namely an upper separating device 10 and thereunder a lower separating device 20, as well as two edge-guiding shields 30 and 40. Each of these separating devices comprises a blade 11 or 21, respectively, being disposed essentially normal relative to the plane of the curtain and making an acute angle with the vertical axis V, and, associated with each of the blades 11 and 21, respectively, an inclined chute 12 or 22, respectively, for leading off the cut-off curtain material waste. The two edge-guiding shields 30 and 40 are connected with the blades 11 and 21 flush with or a short distance underneath the cutting edges of these blades, with the lower end of the blade 11 being located outside and overlapping the upper end cutting edge 22 of the lower blade 21, while the lower end of the edge-guiding shield 40 extends downward to close above the surface of the object O to be coated.

The two separating devices 10 and 20 serve, in connection with the two edge-guiding shields 30 and 40, for laterally limiting the poured curtain C and for removing or eliminating, respectively, as far as possible, the formation of rim beads in the curtain and in the final coating deposited on the object. As will be understood readily from FIG. 1, the two separating devices 10 and 20, being arranged, on each side of the curtain, successively in relation to the direction of fall of the poured curtain C will cut off, in two stages, two marginal strips 51 and 52 of the poured curtain C, and lead off away from the curtain, the coating material waste of the cut-off marginal strips. The upper edge-guiding shield 30 guides the curtain, having been narrowed for the first time by the blade 11, toward the blade 21 of the lower separating device 20, and the lower edge-guiding shield 40 then guides the curtain, having been narrowed for a second time by means of the blade 21, down to the immediate vicinity of the object O.

The excessive marginal zone 51 of the poured curtain C is cut off by the upper separating device 10. On its way from the blade 11 downward along the edge-guiding shield 30, a new marginal bead is formed along the narrowed poured curtain. This bead is then cut off by blade 21 of the lower separating device 20. As, according to a principal feature of the invention, this separating device 20 is located only a short distance above the conveyer belt, and as the edge-cutting shield 40 is correspondingly short, no noteworthy rim bead, which could lead to an inadmissible thickening of the coating edges, can be formed along this shield.

Of essential importance is also the lower separating device 20, its relatively low location relative to the height of the curtain and the short downward extension of its edge-guiding shield 40. At a determined width of the coating to be applied and a relatively short downward path of the curtain, the upper separating device 10 and the edge-guiding shield 30 may be omitted, in which case the lateral curtain guiding member F plays the same part as the shield 30. The explanations given further below with regard to the configuration of the upper edge-guiding shield 30 also apply in this case to the lateral curtain guiding means F.

In order to produce coatings of various breadths, the lower separating device 20 together with its edge-guiding shield 40 is preferably adapted to be adjusted by displacement parallel with the longitudinal extension of the pouring head, which adjustability is indicated by a double arrow Q. In order to assure a problemfree removal of the waste coating material, and for other reasons, it is important that the marginal zone 52 of the pouring curtain C which is being cut off by the separating device 20, be kept relatively small, for instance, of width of about 8 to 20 mm. To comply with this rule in each position of the lower separating device 20, there have been provided the upper separating device 10 and its edge-guiding shield 30, and this separating device has been arranged in fixed association with the lower separating device 20, and is thus adjustable (arrow Q) together with the latter. Of course, in lieu of the upper separating device 10, there could also be arranged displaceably, in a corresponding manner, the lateral curtain guide means F. The mutual positioning of the two separating organs 10 and 20 can be adjusted when required.

The configuration and shaping of the edge-guiding shields 30 and 40, or, when the upper separating organ 10 has been omitted, of the lateral guide F, depends to a certain degree from the rheological properties of the coating material. It is generally advantageous when the lowermost section 31 of the otherwise substantially vertical edge-guiding shield 30 (or, respectively, of the lateral guide F) is inclined outwardly, leading to the broadening of the curtain. The angle $\gamma$ of inclination (FIG. 2) amounts in this case to about 1 to 5 degrees. The length 1 of the inclined section 31 amounts to about 60 to 80 mm, relative to the usual total curtain heights of about 100 to 120 mm. Due to this outwardly inclined section 31, the marginal zone 52 of the curtain C is spread out shortly prior to its being cut off, whereby the rim bead and the above-mentioned marginal zone 52 are made thinner, thus counteracting to the formation of a new rim bead along the lower edge-guiding shield 40.

Figure 2:
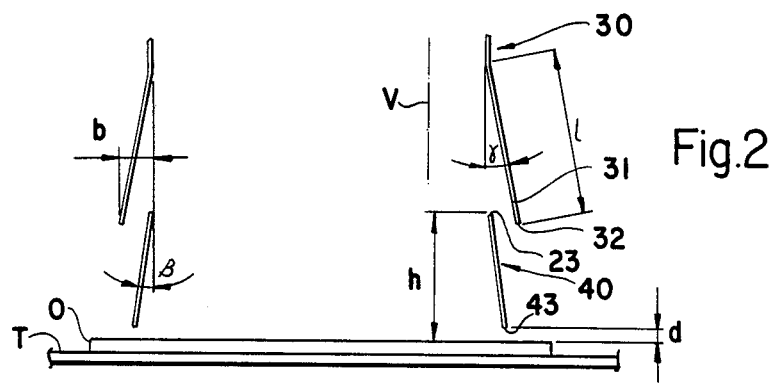
FIGS. 2 to 4 show highly schematical representations of different embodiments of details thereof.

In order to achieve well-defined flow conditions of the material being poured, it is important that the edge-guiding shield 30 extends down to the lower separating organ 20, i.e., the lower edge 32 of the edge-guiding shield 30, or of the lateral guide F, respectively, must be substantially at or below the level of the blade edge 23, i.e. the point of incesion of the blade 21 into the curtain C (FIG. 2).

The lower edge-guiding shield 40 can be of various shapes, depending on the rheological properties of the coating material. The distance h of the cutting edge 23 of the separating blade 21 from the surface of the object 0 to be coated is kept as small as feasible and amounts advantageously to about 30 to 40 mm. The lower edge 43 of the edge-guiding shield 40 extends as close as feasible to the object 0, but it should be far enough therefrom to avoid direct contact therewith due to up-and-down movements of the object to be expected during transportation on the conveyer belt. In practice, a distance d of about 3 to 5 mm should be kept.

Figure 3:
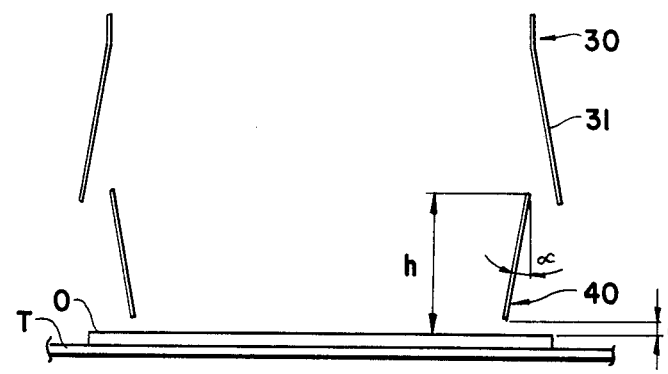
Figure 4:
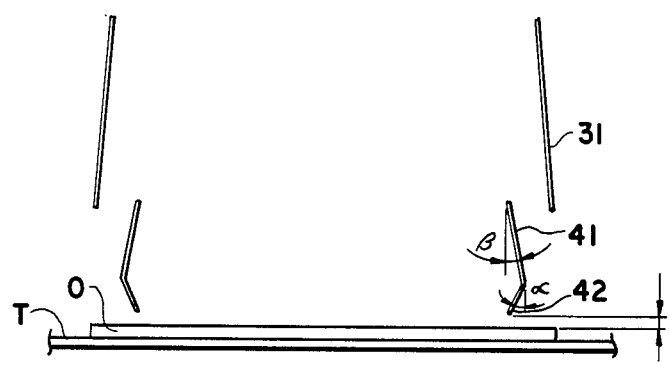

The edge-guiding shield 40 can be inclined inwardly (FIG. 3) at an angle $\gamma$ of from 0 to 5 degrees, or outwardly (FIG. 2) at an angle $\beta$ of from 0 to 5 degrees. When the coating masses described in the initially mentioned European Pat. No. 2040 are to be used, it is of special advantage when the edge-guiding shield consists of two sections 41 and 42 of which the upper one is inclined outwardly and the lower one is inclined inwardly (FIG. 4). This configuration is particularly suited for obtaining stable conditions of flow of the curtain and correspondingly qualitatively satisfactory coatings.

The width b of the marginal zone 52 of the curtain C which is cut off by lower separating organ 20 amounts to about 8 to 50 mm.

What is claimed is:

1. A coating apparatus comprising a conveyer belt for conveying objects to be coated, a pouring head device above said conveyer belt and extending transverse to the direction of movement of the latter, said pouring head device comprising a pouring head adapted for pouring coating material in the form of a curtain freely falling on to the objects being conveyed on said belt, lateral curtain guiding means on both sides of said curtain comprising an outwardly inclined section which serves to spread said curtain, and, at least on one side of said curtain directly below said lateral curtain guiding means, a rim-zone severing device for severing a thickened rim zone of said curtain from a central region of the latter, thereby limiting the width of said curtain, said rim-zone severing device being disposed a short distance above the level of impingement of the curtain on the objects to be coated, and being adapted to remove coating material waste from a cut-off rim zone of said curtain, and an edge-guiding member for guiding the resulting narrow-width curtain, said edge-guiding member extending from a point of cutting engagement of said severing device with said curtain downward to closely above said level of impingement of the resulting narrowed curtain on said objects to be coated.

2. The coating apparatus of claim 1, wherein said rim zone-severing device comprises at least one separating member adapted for cutting off essentially only the rim zone of the poured curtain which rim zone is thickened vis-a-vis the central region of said curtain.

3. The coating apparatus of claim 2, wherein said rim zone-separating member is adapted for cutting off a rim zone having a width of from 6 to 12 mm.

4. The coating apparatus of claim 2, wherein said rim zone-separating member is adapted for cutting off a rim zone having a width of from 8 to 10 mm.

5. The coating apparatus of claim 1, wherein said lateral curtain guiding means extend downwardly at least to said level of impingement of said separating member and said curtain.

6. The coating apparatus of claim 1, wherein said edge-guiding member comprises a downwardly and inwardly inclined part adapted for producing a slight reduction of the width of the narrowed curtain.

7. The coating apparatus of claim 6, wherein said downwardly and inwardly inclined part of said edge-guiding member is inclined against a vertical axis at an angle of about 1 to 8 degrees.

8. The coating apparatus of claim 1, wherein said edge-guiding member comprises a downwardly and outwardly inclined part adapted for producing a slight increase of the width of the narrowed curtain.

9. The coating apparatus of claim 8, wherein said downwardly and outwardly inclined part of said edge-guiding member is inclined against a vertical axis at an angle of about 1 to 8 degrees.

10. The coating apparatus of claim 1, wherein said edge-guiding member comprises a slightly outwardly inclined upper part, and a slightly inwardly inclined lower part.

11. The coating apparatus of claim 1, wherein said outwardly inclined section of said lateral curtain guiding means makes an angle with a vertical axis of 0 to about 5 degrees.

12. The coating apparatus of claim 1, wherein said edge-guiding member has a lower edge being at a distance of from 3 to 5 mm above the object to be coated.

13. The coating apparatus of claim 1, wherein the point of cutting engagement of said rim-severing device with said curtain has a distance of from about 30 to 40 mm from said object to be coated.

14. The coating apparatus of claim 1, wherein said rim-severing device comprises at least one separating member and, associated with each such member, an outwardly inclined chute for leading away cut-off coating material waste.

15. The coating apparatus of claim 14, wherein said rim-severing device comprises two of said separating members, a first one and thereabove a second one, as well as a first and a second edge-guiding member associated respectively, with said first and second separating member, said second separating member being adapted for cutting off a first rim zone of said curtain, said second chute leading off the thus cut-off coating material waste, and said first separating member then cutting off a further rim zone from the narrowed curtain.

16. The coating apparatus of claim 15, wherein said second edge-guiding member comprises, directly above said second separating member, an outwardly inclined section causing a spreading of said curtain prior to said second separating member acting thereon.

17. The coating apparatus of claim 15, wherein said second edge-guiding member extends downwardly at least to said level of engagement of said second separating member with said curtain.

18. The coating apparatus of claim 15, wherein said second edge cutting member has an outwardly inclined section making with a vertical axis an angle of 0 to about 5 degrees.

19. The coating apparatus of claim 15, wherein said first and second separating members, in common, respectively, with their first and second edge-guiding members, are in a direction parallel with said pouring head, so as to define the width of the curtain to be poured.

* * * * *